(12) United States Patent
Kowada et al.

(10) Patent No.: US 8,698,005 B2
(45) Date of Patent: Apr. 15, 2014

(54) PACKAGE STRUCTURE, METHOD FOR MANUFACTURING SAME, AND METHOD FOR REPAIRING PACKAGE STRUCTURE

(75) Inventors: Hiroe Kowada, Osaka (JP); Atsushi Yamaguchi, Osaka (JP)

(73) Assignee: Panasonic Corporation, Osaka (JP)

( * ) Notice: Subject to any disclaimer, the term of this patent is extended or adjusted under 35 U.S.C. 154(b) by 51 days.

(21) Appl. No.: 13/580,856

(22) PCT Filed: Apr. 7, 2011

(86) PCT No.: PCT/JP2011/002062
§ 371 (c)(1),
(2), (4) Date: Aug. 23, 2012

(87) PCT Pub. No.: WO2011/158412
PCT Pub. Date: Dec. 22, 2011

(65) Prior Publication Data
US 2012/0320539 A1     Dec. 20, 2012

(30) Foreign Application Priority Data
Jun. 15, 2010   (JP) ................... 2010-135639

(51) Int. Cl.
*H05K 1/16* (2006.01)

(52) U.S. Cl.
USPC ......................................... 174/260; 361/760

(58) Field of Classification Search
USPC .................. 174/250, 257–261; 361/760, 748; 29/831, 841; 257/787–796
See application file for complete search history.

(56) References Cited

U.S. PATENT DOCUMENTS

| | | | |
|---|---|---|---|
| 6,796,482 B2* | 9/2004 | Wetz et al. | 228/207 |
| 7,794,531 B2* | 9/2010 | Abys et al. | 106/14.13 |
| 7,926,700 B2* | 4/2011 | Schmitt et al. | 228/248.1 |
| 8,344,268 B2 | 1/2013 | Tsujimura et al. | |
| 2002/0195171 A1* | 12/2002 | Li et al. | 148/25 |
| 2010/0148362 A1* | 6/2010 | Sakurai | 257/737 |

FOREIGN PATENT DOCUMENTS

| | | |
|---|---|---|
| JP | 2000-302985 | 10/2000 |
| JP | 2001-170798 | 6/2001 |
| JP | 2001-237351 | 8/2001 |
| JP | 2003-179097 | 6/2003 |
| JP | 2003-246828 | 9/2003 |
| JP | 2009-032732 | 2/2009 |
| JP | 2009-067818 | 4/2009 |
| JP | 2010-34550 | 2/2010 |
| JP | 2010-123911 | 6/2010 |

* cited by examiner

*Primary Examiner* — Yuriy Semenenko
(74) *Attorney, Agent, or Firm* — Hamre, Schumann, Mueller & Larson, P.C.

(57) ABSTRACT

A package structure including an electronic component 2 mounted on a circuit board 1 with a bonding metal 3, wherein a flux 4 contains a compound having a hydroxyl group and remains on the surface of the bonding metal 3, a coating resin 5 contains 10% to 50% by weight of isocyanate, and a reactant 8 of the coating resin 5 and the flux 4 is formed at an interface between the flux 4 and the coating resin 5. Water resistance and moisture resistance can be obtained without cleaning the flux 4. The coating resin 5 can be easily peeled off at a temperature not lower than the glass transition point temperature of the flux 4.

10 Claims, 4 Drawing Sheets

PACKAGE STRUCTURE, METHOD FOR MANUFACTURING SAME, AND METHOD FOR REPAIRING PACKAGE STRUCTURE

TECHNICAL FIELD

The present invention relates to a package structure in which an electronic component mounted on a substrate and the like is coated with a resin composition to have higher resistance to water and moisture.

BACKGROUND ART

In order to improve the reliability of electronic components, a resin coating is applied to an electronic component and a circuit board on which the electronic component is mounted, so that the electronic component is not affected by moisture and dust in an environment and is protected from vibrations and impacts.

Such a resin for coating needs to have high resistance to heat, excellent insulation, high flexibility, high resistance to wear, and high adhesion. The resin for coating includes at least one of acrylic resin, urethane resin, poly-olefin resin, and silicon resin. The resin is evenly applied in a liquid state. In the case of a resin containing a solvent, the resin is cured on a joint structure after volatilization, achieving a desired coating resin.

In recent years, particularly, circuit boards mounted in electronic controls around the engine rooms of vehicles need to be resistant to high temperatures of about 150° C. For water resistance of circuit boards, resins such as epoxy resin, urethane resin, and silicon resin are used in view of heat resistance and a gas barrier. Particularly, urethane resin has received attention because of its cost effectiveness.

A conventional urethane resin contains polyester polyol or polybutadiene as a base resin to prevent migration in a hot and humid environment (for example, see patent literature 1).

CITATION LIST

Patent Literature

Patent Literature 1: Japanese Patent Laid-Open No. 2009-67818

SUMMARY OF INVENTION

Technical Problem

When a circuit board serving as a substrate is coated with urethane resin, a flux used for obtaining solderability for an electronic component may remain on the circuit board. In this case, activator components contained in the flux, e.g., amine and an organic acid may interfere with curing of the resin, thereby reducing the degree of cure of a resin film and resulting in insufficient film strength.

Furthermore, in a use environment where a circuit board is exposed to a high temperature of about 150° C., a flux remaining on the circuit board may crack and affect a coating film, causing a coating resin to be peeled off.

To address this problem under present circumstances, in the case of a water-resistant and moisture-resistant coating, a flux remaining on a circuit board is washed off with water, warm water, or a flux cleaner containing an alcohol solvent and a surface-active agent.

Moreover, in a repair of a defective electronic component in a manufacturing process or in the market, a coating resin needs to be peeled off from a circuit board. However, urethane resin with high adhesion cannot be easily peeled off, resulting in difficulty in obtaining a simple operation and higher productivity.

An object of the present invention is to provide a package structure that can obtain high water resistance and moisture resistance for an electronic component and allow the electronic component to have high repairability.

Solution to Problem

A package structure according to the present invention in which an electronic component is mounted on a circuit board with a bonding metal, including: a coating resin that contains 10% to 50% by weight of isocyanate and covers the circuit board, the electronic component, and the bonding metal; a flux that contains a compound having a hydroxyl group and remains on the surface of the bonding metal; and a reactant of the coating resin and the flux, the reactant being formed at an interface between the flux and the coating resin.

A method for manufacturing a package structure according to the present invention, including: mounting an electronic component on a circuit board with a bonding metal by means of a flux; covering the circuit board, the electronic component, and the bonding metal with a coating resin containing 10% to 50% by weight of isocyanate; and producing a reactant at an interface between the coating resin and the flux containing a compound having a hydroxyl group.

A method for repairing a package structure according to the present invention, in replacement of an electronic component of the package structure in which the electronic component is mounted on a circuit board with a bonding metal, the circuit board, the electronic component, and the bonding metal are covered with a coating resin containing 10% to 50% by weight of isocyanate, and a reactant of the coating resin and a flux is formed at an interface between the coating resin and the flux that contains a compound having a hydroxyl group and remains on the surface of the bonding metal, the method including: setting the reactant at least to the glass transition point temperature of the flux to soften the reactant and peel off the coating resin around the electronic component; and removing the electronic component from the circuit board for replacement.

Advantageous Effects of Invention

With this configuration, the coating resin is applied to the circuit board, the electronic component on the circuit board, and a joint of the circuit board and the electronic component after mixing of a base resin and a curing agent. In the coating resin immediately after the application, polyol serving as a base resin and isocyanate serving as a curing agent have not fully reacted, leaving an unreacted isocyanate group on an end of the coating resin. Since the isocyanate group reacts with the hydroxyl group in the solder flux, curing is completed with contained flux components, eliminating the need for cleaning the flux. This achieves a lighter workload, higher productivity, and lower cost.

Furthermore, in the event of a failure on the electronic component on the circuit board, heat is applied to and around the electronic component at least to the glass transition point temperature of the flux, so that the hardness of the coating resin decreases around the electronic component or on the flux on the sides of the electronic component as the flux components soften. This allows the coating resin to be easily peeled off without damaging electronic components around the coating resin, reducing a workload for a repair.

DESCRIPTION OF EMBODIMENTS

A method for manufacturing a package structure and a method for repairing the same according to the present invention will be described below with reference to specific embodiments.

First Embodiment

Figure 1:
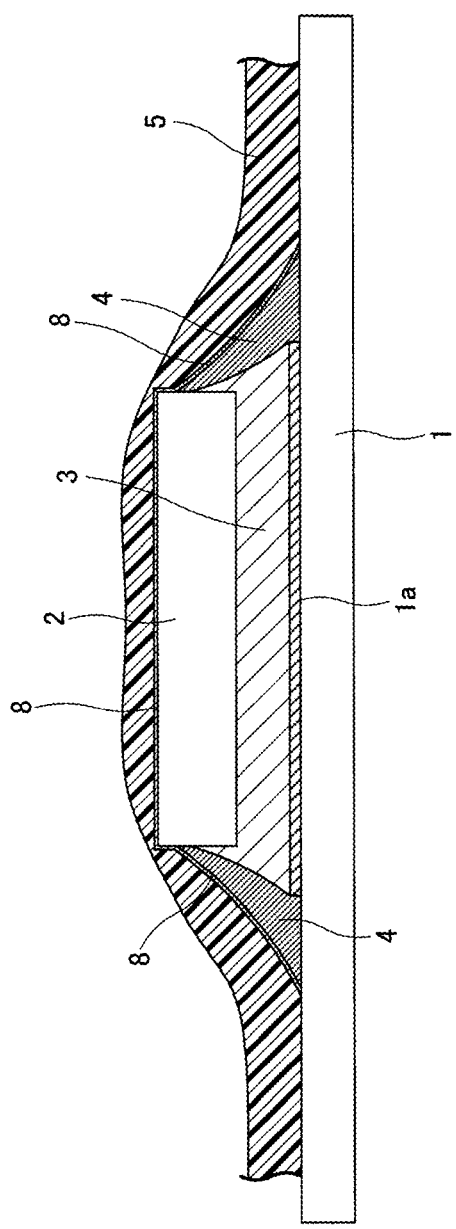
FIG. 1 is an enlarged cross-sectional view illustrating a package structure according to a first embodiment of the present invention.

FIG. 1 illustrates a package structure according to a first embodiment.

In the package structure, an electronic component 2 is mounted on a wiring pattern 1a of a circuit board 1 with solder 3 acting as a bonding metal. Moreover, the circuit board 1, the electronic component 2, and the solder 3 are covered with an applied coating resin 5 so as to have desired resistance to water and moisture. A flux 4 deposited on the surface of the solder 3 is a residue used for properly soldering the electronic component 2 onto the wiring pattern 1a.

At an interface between the flux 4 and the coating resin 5, a reactant 8 of the flux 4 and the coating resin 5 is formed. In the first embodiment, the reactant 8 is formed on the top surface of the electronic component 2 as well as the sides of the electronic component.

The electronic component 2 is useful in the case of a chip size package (CSP) or a ball grid array (BGA) package. In many cases, multiple semiconductor components are mounted on a single substrate. The semiconductor components are expensive and thus a repair needs to be easily made. Furthermore, a short circuit caused by water needs to be prevented during the energization of the electronic components.

The type of the circuit board 1 is not particularly limited. For example, a substrate containing glass fibers or a heat-resistant resin is used. Typically, a circuit board includes a copper foil wire printed on glass fabric impregnated with epoxy resin or the like.

Figure 2:
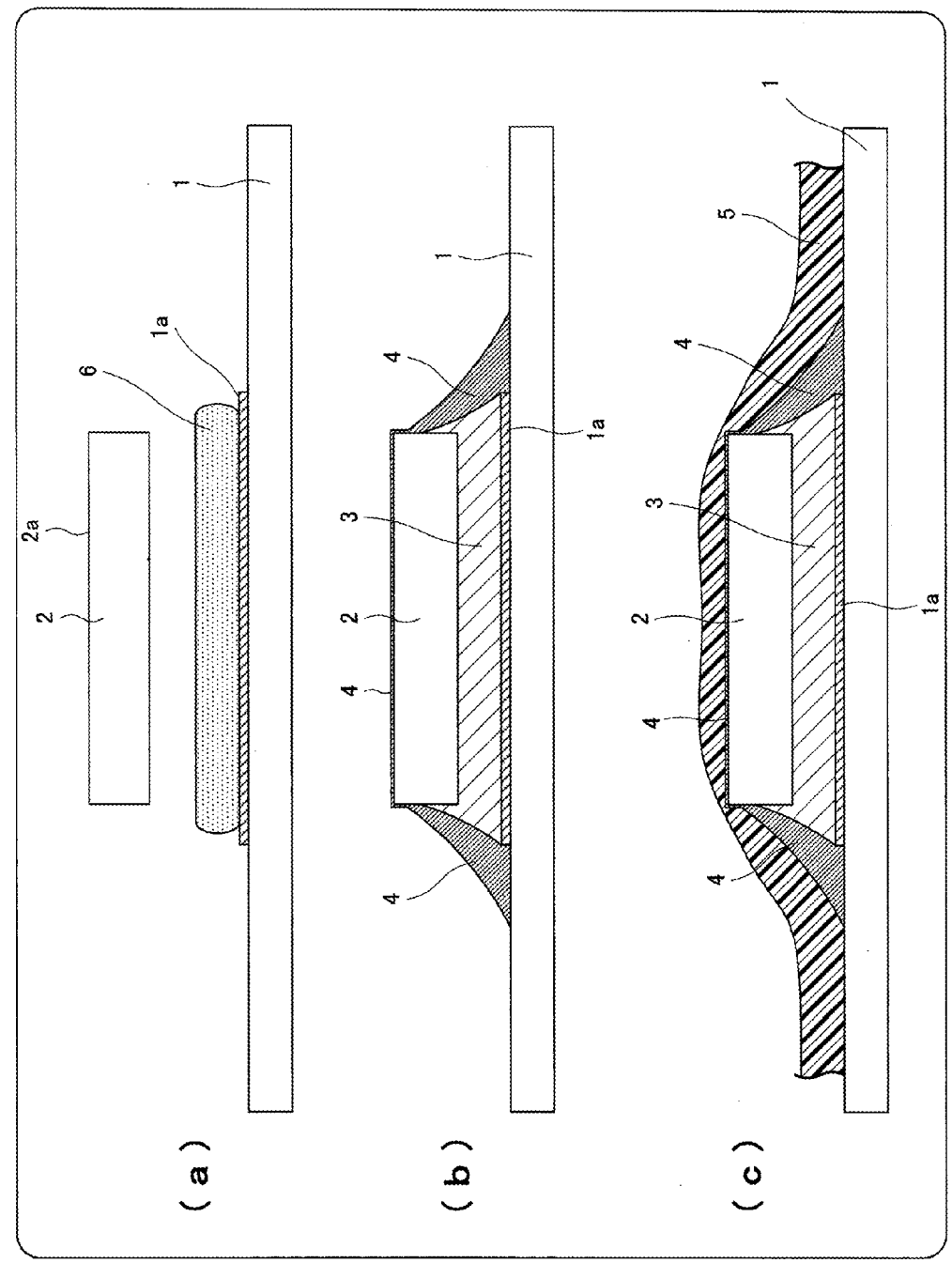
FIG. 2 is a manufacturing process drawing according to the first embodiment of the present invention.

The package structure can be manufactured by a process illustrated in FIG. 2.

In FIG. 2(a), cream solder 6 is supplied onto the wiring pattern 1a at the mounting position of the electronic component 2 by a dispenser or the like. The cream solder 6 is prepared by kneading the flux 4 with particles of the solder 3.

The electronic component 2 is then set on the cream solder 6 and is passed through a reflow furnace. Thus, as illustrated in FIG. 2(b), the electronic component 2 is bonded to the wiring pattern 1a with the solder 3 in the cream solder 6, and the flux 4 is deposited on the surface of the solder 3. The molten flux is partially spread and deposited on a top surface 2a of the electronic component 2 by a surface tension.

In an ordinary coating process using the coating resin 5 on the surface of the solder 3, the coating resin 5 is applied after the residual flux 4 deposited on the surface of the solder 3 and the top surface 2a of the electronic component 2 is completely removed by a cleaning process. In the first embodiment, as illustrated in FIG. 2(c), the coating resin 5 is applied onto the flux 4 so as to cover the circuit board 1, the electronic component 2, and the solder 3, eliminating the need for a conventional flux cleaning process.

In the reactant 8 for obtaining resistance to water and moisture without using a flux cleaning process, the flux 4 and the coating resin 5 contain the following components.

The coating resin 5 contains a base resin and a curing agent.

The curing agent of the coating resin 5 preferably contains a thermosetting resin. The curing agent may contain a resin curable by moister in the air. The curing temperature of the resin of the curing agent is not particularly limited but a hardening resin curable at a temperature lower than 150° C. is desirably used to avoid an adverse effect on the solder 3 on the circuit board. In other words, when a resin composition is cured, a temperature of 150° C. or lower is desirably selected as a curing temperature.

The base resin of the coating resin 5 may contain, as polyol components, polybutadiene and polyisoprene having at least two hydroxyl groups or polyolefin prepared by adding hydrogen to the double bond of polybutadiene and polyisoprene. The use of polyol can obtain polyurethane as a proper elastomer (rubber elastic body) that has excellent insulation while keeping high heat resistance in contact with the circuit board and an electric/electronic component. The molecular weight (number average) of the polyol having at least two hydroxyl groups is preferably 700 to 8000, more preferably 1000 to 5000, and still more preferably 1500 to 4000.

The curing agent of the coating resin 5 can contain known compounds as principal components. For example, the curing agent can contain, as compounds having isocyanate groups, aromatic isocyanate such as toluylene 2, 4-diisocyanate (TDI), diphenylmethane diisocyanate (MDI), and xylylene diisocyanate (XDI), aliphatic isocyanate such as hexamethylene-diisocyanate (HMDI), and alicyclic isocyanate such as isophorone diisocyanate (IPDI). One of the compounds or a mixture of at least two of the compounds may be used. Among these compounds, diphenylmethane diisocyanate and isophorone diisocyanate are preferable because of its low cost, ease of handling in a liquid state, and safety with low volatility.

The coating resin 5 may, if necessary, contain various additives. The additives may contain a curing catalyst, a foam stabilizer, an emulsifier, fire retardants such as a phosphorus compound and a halogen compound, an antioxidant, an age resister, a UV absorber, a plasticizer, fillers such as talc, clay, calcium carbonate, silica powder, alumina, carbon black, titanium oxide, and iron oxide, a dye, and a pigment if necessary.

In the case where the amount of isocyanate is too small in the curing agent of the coating resin, the coating resin 5 does not sufficiently react with the flux 4, resulting in lower adhesion at the interface between the flux 4 and the film. Thus, the coating resin 5 cannot be thick enough to obtain resistance to water and moisture. In the case where the amount of isocyanate is too large, a crosslink density excessively increases in the resin composition so as to reduce adhesion between the electronic component and the substrate, impairing the function of a coating agent for obtaining resistance to water and moisture. In order to stably react the coating resin 5 with the flux 4 so as to secure the waterproofing and insulating function of the coating agent in a balanced manner, it is effective to set the amount of isocyanate to 10% to 50% by weight relative to the base resin.

The components of the flux 4 are not particularly limited as long as the flux 4 contains a compound having a hydroxyl group.

For example, the principal components of the flux may be conventionally known components including resins such as rosin and synthetic resin and organic components such as organic acid, an organic halogen compound, amines, and amides. Furthermore, the flux may contain activators including phosphoric acid, ammonium phosphate salt, organic carboxylic acid (e.g., stearic acid, adipic acid, and salicylic acid), lactic acid, glutamic acid, fatty amide, urea, ethylenediamine, and aliphatic amine; plasticizers including phthalate ester (e.g., dibutyl phthalate and dioctyl phthalate), esters of carboxylic acids (e.g., dibutyl adipate and dioctyl malate), and phosphoric ester (e.g., trioctyl phosphate, triphenyl phosphate, and tricresyl phosphate); solvents including ethylene glycol, diethylene glycol monobutyl ether, triethylene glycol monomethyl ether, ethylene glycol monophenyl ether, polyethylene glycol, dipropylene glycol, and aliphatic alcohol; waxes such as hydrogenated castor oil; viscosity improvers such as fine silica powder; antioxidants such as hindered phenols and hindered amines; and silicon antifoaming agents.

As has been discussed, the flux 4 is supplied with the solder 3 when the electronic component is mounted on the circuit board. After reflowing, the flux 4 is disposed around the joint of the mounted electronic component and on the top surface and sides of the electronic component in the foregoing manner.

The coating resin 5 is prepared by, for example, introducing the base resin and the curing agent separately into a mixer part of a two-liquid dispenser with a specified quantity ratio and sufficiently mixing the base resin and the curing agent. A reaction starts at the time of mixing in the mixer part. The mixed base resin and curing agent are fed from the mixer to a nozzle part and then are applied onto the circuit board 1 and the electronic component 2 from the tip of a nozzle. After that, the resin composition is cured to obtain a package structure coated with the coating resin 5. The coating resin 5 was adjusted to a viscosity of 10 mPa·s to 10 Pa·s after the mixing of the base resin and the curing agent.

The coating resin 5 applied by the dispenser preferably has a thickness of about 5% to 50% on the top surface of the electronic component 2 on the circuit board 1 relative to a thickness of the coating resin 5 on the top surface of the circuit board 1. Moreover, the coating resin 5 on the top surface of the circuit board 1 is preferably 5 to 30 times as thick as the coating resin 5 on the sides of the electronic component.

In the application of the base resin and the curing agent of the coating resin 5 onto the circuit board 1, when a compound having an isocyanate group comes into contact with the flux 4 around the joint of the electronic component 2, a hydroxyl group contained in the flux 4 and the isocyanate group reacts with each other to form the reactant 8 having a urethane bond. The reaction of the hydroxyl group and the isocyanate group occurs also at room temperatures depending upon the type of isocyanate, and the reaction is accelerated by heating. Thus, a high reaction rate can be obtained and only a small amount of the hydroxyl group remains unreacted. Since the urethane bond has extremely low water absorbency, the flux having reacted with the isocyanate group is mixed with the resin with stability, thereby keeping the adhesion of the coating film with insulation.

The coating resin 5 is applied at a room temperature (25° C.) within one hour from the mixing. In the case of application after one hour from the mixing, the reactant 8 could not be suitably obtained. The mixed coating resin 5 further reacts at a temperature higher than the room temperature, leading to a shorter application time.

In the case where some of the electronic components 2 are found defective after the electronic components 2 are soldered to be mounted to the circuit board 1 and are covered with the resin composition, only the defective electronic components need to be removed. In this case, in the package structure having the reactant 8 at the interface between the flux 4 and the coating resin 5 according to the first embodiment, a repair can be made more easily than in the conventional structure as follows.

Figure 3:
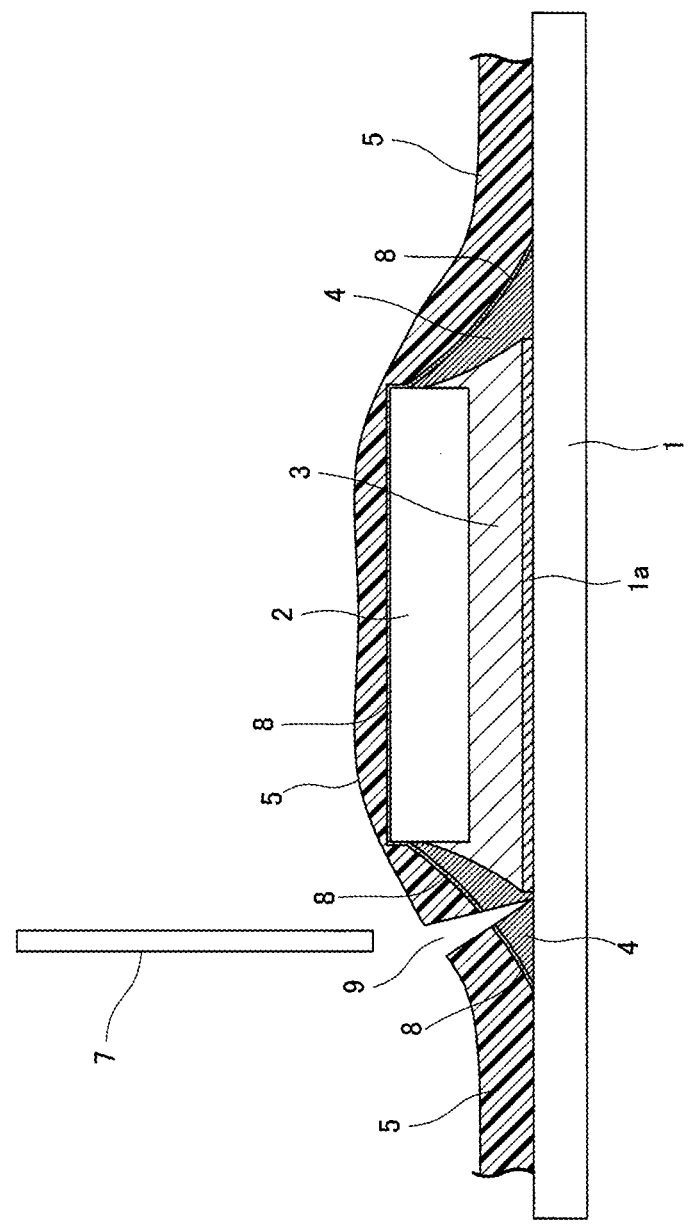
FIG. 3 is an explanatory drawing showing peeling of a coating of the package structure according to the first embodiment of the present invention.

FIG. 3 illustrates a step of peeling off the coating film in a repair process.

In the peeling step, the electronic component 2 is heated at least to the glass transition point temperature of the flux 4, and the coating resin 5 is cut and removed by a cutting tool 7 on the flux 4 around the electronic component 2 or on the sides of the electronic component. The coating resin 5 having reacted with the flux is softened by heat and thus can be easily removed, allowing the defective package structure to be easily repaired.

Specifically, when the coating resin 5 is removed, the heating temperature of the electronic component 2 is desirably 40° C. to 200° C., more desirably 80° C. to 190° C. At a temperature lower than 40° C., the flux 4 is not softened and thus the coating resin 5 hardly becomes removable. At 190° C. or higher, the solder 3 may be melted so as to cause solder flash before the removal of the coating resin 5, resulting in a faulty joint.

A slit 9 is made on a remaining part of the flux 4 around the electronic component 2 by a spatula acting as the cutting tool 7, enabling a cut around the electronic component 2. This allows the coating resin 5 joined to the softened flux 4 to be peeled off at the interface of the circuit board 1.

The flux 4 spreads around the electronic component 2 and to the top surface and the sides of the electronic component 2 when the electronic component 2 is bonded with solder. Thus, the formation of the slit 9 around the electronic component 2 allows the coating resin 5 to be easily peeled off.

After the coating resin 5 is peeled off, the electronic component 2 is heated at least to the melting temperature of the solder 3, to be specific, 250° C. or higher, so that the electronic component 2 can be easily removed from the circuit board 1.

The manufacturing method will be more specifically described below with reference to an example and comparative examples 1 and 2.

Example (i) Preparation of a Coating Resin Composition

A two-part urethane resin (SU-3001(trade name), SANYU REC Co., Ltd.) was used as the coating resin 5. Polyol serving as a base resin and isocyanate serving as a curing agent were mixed in a 100:30 ratio.

The used cream solder 6 contained a solder metal and a flux. The solder metal had a composition of Sn-3Ag-0.5Cu, and the flux contained a high boiler, rosin, an activator, a thixotropic agent, and so on.

(ii) Mounting of an Electronic Component on a Substrate

By using predetermined printer, mounter, and reflow furnace, a 10-mm-square electronic component of CSP (Chip size package) was bonded to a circuit board equivalent to FR-5 type, in which a copper foil was printed on glass fabric impregnated with epoxy resin. The CSP includes solder bumps (melting at 220° C.) with a land pitch (a center distance between the solder bumps) of 0.5 mm and metal leads.

(iii) Coating Step

The predetermined resin composition was applied from the two-liquid dispenser to the circuit board 1 and the electronic component 2 mounted on the circuit board 1.

An assembly of the circuit board 1 and the electronic component 2 with the resin composition was placed into an oven set at 100° C. and was heated at 100° C. for five minutes to cure the resin, completing the assembly coated with the resin.

Comparative Examples 1 and 2

Silicone resin was applied with a thickness of 100 μm to the circuit board 2 on which the electronic component 2 had been mounted, and then the silicone resin was cured at a curing temperature for a curing time, producing a sample of comparative example 1.

Additionally, the circuit board 1 prepared under the same conditions was cleaned with a cleaning fluid, the flux 4 was removed, the circuit board 1 was coated with the urethane resin, and then the circuit board 1 was similarly dried at 100° C. for five minutes, producing a sample of comparative example 2.

<<Evaluations>>

A curing state of the coating was evaluated as follows:

First, the resin surfaces of the samples of the example, comparative example 1, and comparative example 2 were touched with cotton-gloved fingers to check the adhesion of the resin on the glove, allowing an examination of a degree of curing.

The results are shown in Table 1.

In Table 1, "Good" represents the absence of the adhesion of the resin and "Poor" represents the presence of the adhesion of the resin.

TABLE 1

|  | Example | Comparative Example 1 |
| --- | --- | --- |
| Used Resin | Urethane Resin | Silicone Resin |
| Curing Temperature [° C.] | 100 | 150 |
| Curing Time [min] | 5 | 60 |
| Finger Touch | Good | Poor |

As shown in Table 1, in comparative example 1, resin at a flux-bearing joint adhered to a cotton glove even after a predetermined curing process. For confirmation, the resin was cured at 100° C. for 24 hours and then finger touch was similarly checked. In this case, the adhesion of the resin was confirmed. Thus, the presence of the flux 4 is deemed to interfere with curing and result in insufficient curing of the resin. In contrast, in the example and comparative example 2, the adhesion of resin on a cotton glove was not confirmed. Hence, the resin can be sufficiently cured even in the presence of the flux.

Furthermore, the releasability of the coating film in a repair and the ease of repairing the electronic component were evaluated as follows:

First, the samples of the example and comparative example 2 were set in a general-purpose reworking machine of vertical heated air type. A joint of the assembly coated with the cured resin composition was heated to 180° C. When the joint reached 180° C., as shown in FIG. 3, the slit 9 was made on a remaining part of the flux 4 around the electronic component 1 by using the cutting tool 7 so as to make a cut around the electronic component, the coating resin 5 was peeled off, and a rate of the remaining coating resin was examined. The results are shown in Table 2.

TABLE 2

|  | Example | Comparative Example 2 |
| --- | --- | --- |
| Used Resin | Urethane Resin | Urethane Resin |
| Curing Temperature [° C.] | 100 | 100 |
| Curing Time [min] | 5 | 5 |
| Flux | Unwashed | Washed |
| Finger Touch Dryness | Good | Good |
| Remaining Area after Peeling/mm$^2$ | 4/144 | 125/144 |
| Component Removal | Removable | Unremovable |
| Comprehensive Judgment | Good | Poor |

In Table 2, denominators represent the areas of the cut resin and numerators represent the areas of the remaining coating film after peeling. The assembly was further heated to 250° C., which is not lower than the melting temperature of the solder 3, and then the electronic component was attempted to remove from the circuit board 1 by a rubber suction nozzle (8 mm in diameter) having a suction force allowing a lift of about 200 g. The results are shown in Table 2. In Table 2, "Removable" means that the electronic component can be removed from the circuit board, and "Unremovable" means that the electronic component cannot be removed from the circuit board.

In the example and comparative example 2, the releasability of the coating film was examined during a repair. As shown in Table 2, in the comparative example 2, adhesion between the circuit board and the resin was so high that the resin was hard to peel off and remains over a large area, whereas in the example, the resin was easily peeled off at the interface of the circuit board by heating and thus hardly remained after peeling. Moreover, as shown in Table 2, the electronic component in the example could be removed from the circuit board by a weak suction force of the suction nozzle, whereas in comparative example 2, the electronic component could not be removed from the circuit board. Thus, heating on the coating film applied onto the flux softens the flux at the interface of the circuit board so as to easily peel off the coating film, facilitating a repair of the electronic component.

Second Embodiment

Figure 4:
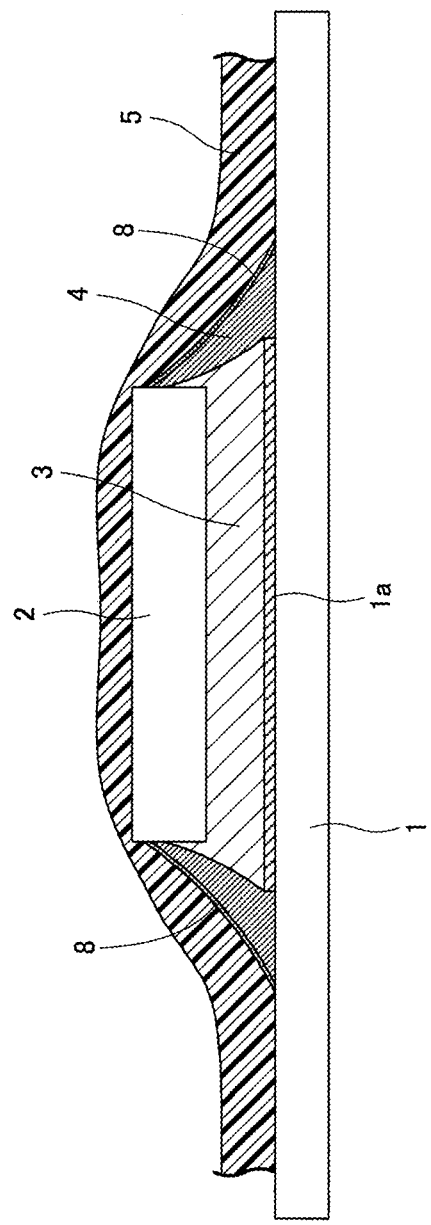
FIG. 4 is an enlarged cross-sectional view illustrating a package structure according to a second embodiment of the present invention.

FIG. 4 illustrates a package structure according to a second embodiment.

In the first embodiment, a solder joint is made using a reflow furnace, forming the reactant 8 also on the top surface 2a of the electronic component 2. As illustrated in FIG. 4, even in the case where a flux 4 has little solder wettability to the top surface of an electronic component 2 and a reactant 8 is not formed on the top surface of the electronic component 2, higher repairability can be obtained than in the conventional structure by using the flux 4 and the coating resin 5 of the first embodiment, the coating resin 5 covering a circuit board 1, the electronic component 2, and solder 3.

INDUSTRIAL APPLICABILITY

A coating resin composition according to the present invention is suitable for the packaging field in which moisture is likely to make direct contact with a circuit board. Particularly, the coating resin composition is useful for a junction structure including an electronic component surface-mounted on a substrate. The present invention is suitable for the packaging field in which a repair is made for a failure, achieving higher productivity.

The invention claimed is:

1. A package structure in which an electronic component is mounted on a circuit board with a bonding metal, comprising:
   a coating resin that contains 10% to 50% by weight of isocyanate and covers the circuit board, the electronic component, and the bonding metal;
   a flux that contains a compound having a hydroxyl group and remains on a surface of the bonding metal; and
   a reactant of the coating resin and the flux, the reactant being formed at an interface between the flux and the coating resin.

2. The package structure according to claim 1, wherein the flux is disposed on a top surface and sides of the electronic component.

3. The package structure according to claim 1, wherein the coating resin has a thickness of 5% to 50% on a top surface of the electronic component relative to a thickness of the coating resin on a top surface of the circuit board.

4. The package structure according to claim 1, wherein the coating resin on a top surface of the circuit board is 5 to 30 times as thick as the coating resin on sides of the electronic component.

5. The package structure according to claim 1, wherein the reactant contains a material that softens at a temperature not lower than a glass transition point temperature of the flux.

6. A method for manufacturing a package structure, comprising:
   mounting an electronic component on a circuit board with a bonding metal by means of a flux;
   covering the circuit board, the electronic component, and the bonding metal with a coating resin containing 10% to 50% by weight of isocyanate; and
   producing a reactant at an interface between the coating resin and the flux containing a compound having a hydroxyl group.

7. The method for manufacturing a package structure according to claim 6, wherein the coating resin has a viscosity of 10 mPa·s to 10 Pa·s after mixing of a base resin and a curing agent, and
   the coating resin is applied within one hour from the mixing.

8. The method for manufacturing a package structure according to claim 6, wherein the reactant contains a material that softens at a temperature not lower than a glass transition point temperature of the flux.

9. A method for repairing a package structure, in replacement of an electronic component of the package structure in which the electronic component is mounted on a circuit board with a bonding metal, the circuit board, the electronic component, and the bonding metal are covered with a coating resin containing 10% to 50% by weight of isocyanate, and a reactant of the coating resin and a flux is formed at an interface between the coating resin and the flux that contains a compound having a hydroxyl group and remains on a surface of the bonding metal,
   the method comprising:
   setting the reactant at least to a glass transition point temperature of the flux to soften the reactant and peel off the coating resin around the electronic component; and
   removing the electronic component from the circuit board for replacement.

10. The method for repairing a package structure according to claim 9, wherein the coating resin is peeled off by forming a slit on the coating resin on the flux around the electronic component or on sides of the electronic component.

* * * * *